(12) United States Patent
Chang et al.

(10) Patent No.: US 8,865,578 B2
(45) Date of Patent: Oct. 21, 2014

(54) METHOD OF MANUFACTURING POLYCRYSTALLINE SILICON LAYER, AND METHOD OF MANUFACTURING TRANSISTOR HAVING THE POLYCRYSTALLINE SILICON LAYER

(75) Inventors: Young-Jin Chang, Yongin (KR); Jae-Hwan Oh, Yongin (KR); Won-Kyu Lee, Yongin (KR); Seong-Hyun Jin, Yongin (KR); Jae-Beom Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 549 days.

(21) Appl. No.: 13/186,974

(22) Filed: Jul. 20, 2011

(65) Prior Publication Data
US 2012/0021585 A1 Jan. 26, 2012

(30) Foreign Application Priority Data
Jul. 23, 2010 (KR) .......................... 10-2010-0071598

(51) Int. Cl.
*H01L 21/20* (2006.01)
*H01L 27/12* (2006.01)
*H01L 21/02* (2006.01)

(52) U.S. Cl.
CPC ...... *H01L 27/1214* (2013.01); *H01L 21/02422* (2013.01); *H01L 21/02675* (2013.01); *H01L 21/02532* (2013.01)
USPC ..... 438/482; 438/486; 438/487; 257/E21.134

(58) Field of Classification Search
USPC .................. 438/482, 486, 487; 257/E21.134
See application file for complete search history.

(56) References Cited

U.S. PATENT DOCUMENTS

| 6,982,195 B2 * | 1/2006 | Lin et al. ..................... 438/166 |
| 7,612,379 B2 * | 11/2009 | Morimoto et al. ............ 257/74 |
| 2009/0191672 A1 * | 7/2009 | Kunii ........................... 438/157 |

FOREIGN PATENT DOCUMENTS

| KR | 10-0371729 B1 | 1/2003 |
| KR | 10-2005-0057923 A | 6/2005 |
| KR | 10-2006-0039773 A | 5/2006 |
| KR | 10-0870259 B1 | 11/2008 |
| KR | 10-2009-0103553 A | 10/2009 |
| WO | WO 95/28820 A1 | 10/1995 |
| WO | WO 03/019290 A2 | 3/2003 |

* cited by examiner

*Primary Examiner* — Ha Tran T Nguyen
*Assistant Examiner* — Suberr Chi
(74) *Attorney, Agent, or Firm* — Lee & Morse, P.C.

(57) ABSTRACT

An embodiment is directed to a method of manufacturing a polycrystalline silicon layer, the method including providing a crystallization substrate, the crystallization substrate having an amorphous silicon layer on a first substrate, providing a reflection substrate, the reflection substrate having a first region with a reflection panel therein and a second region without the reflection panel, disposing the crystallization substrate and the reflection substrate on one another, and selectively crystallizing the amorphous silicon layer by directing a laser beam onto the crystallization substrate and the reflection substrate, and reflecting the laser beam from the reflection panel.

22 Claims, 4 Drawing Sheets

METHOD OF MANUFACTURING POLYCRYSTALLINE SILICON LAYER, AND METHOD OF MANUFACTURING TRANSISTOR HAVING THE POLYCRYSTALLINE SILICON LAYER

BACKGROUND

1. Field

Embodiments relate to a method of manufacturing a polycrystalline silicon layer, and a method of manufacturing a transistor having the polycrystalline silicon layer.

2. Description of the Related Art

In general, a thin-film transistor having a polycrystalline silicon layer may exhibit high electron mobility and may be suitable for a complementary metal-oxide semiconductor (CMOS) circuit. A thin-film transistor having a polycrystalline silicon layer may be used for, e.g., a switching device of a high-resolution display panel and a projection panel that requires a large amount of light.

A method of crystallizing amorphous silicon into polycrystalline silicon may include a solid phase crystallization (SPC) operation, in which an amorphous silicon layer is annealed for several hours to tens of hours at a temperature of about 700° C. or less. A method of crystallizing amorphous silicon into polycrystalline silicon may include an excimer laser annealing (ELA) operation in which a part of an amorphous silicon layer is heated to a high temperature for a very short time by scanning excimer layer onto the amorphous silicon layer, thereby crystallizing the amorphous silicon layer. A method of crystallizing amorphous silicon into polycrystalline silicon may include a metal induced crystallization (MIC) operation that utilizes a phenomenon that a phase change from an amorphous silicon layer to a polycrystalline silicon layer is induced by metal, such as nickel, palladium, gold, or aluminum, by allowing the metal to contact the amorphous silicon layer or injecting the metal into the amorphous silicon layer. A method of crystallizing amorphous silicon into polycrystalline silicon may include a metal induced lateral crystallization (MILC) method, in which crystallization of amorphous silicon sequentially occurs as silicide generated by a reaction between metal and silicon continuously propagates to a side surface.

SUMMARY

An embodiment is directed to a method of manufacturing a polycrystalline silicon layer, the method including providing a crystallization substrate, the crystallization substrate having an amorphous silicon layer on a first substrate, providing a reflection substrate, the reflection substrate having a first region with a reflection panel therein and a second region without the reflection panel, disposing the crystallization substrate and the reflection substrate on one another, and selectively crystallizing the amorphous silicon layer by directing a laser beam onto the crystallization substrate and the reflection substrate, and reflecting the laser beam from the reflection panel.

The crystallization substrate may have a buffer layer between the first substrate and the amorphous silicon layer.

The first substrate may include a transparent material, the laser beam passing through the first substrate.

The first substrate may be a glass substrate.

The reflection substrate may include a second substrate, the reflection panel being a pattern on the second substrate, and a protection film arranged on the second substrate to cover the reflection panel.

The second substrate may include a transparent material, the laser beam passing through the transparent material.

The second substrate may be glass or quartz.

The reflection panel may include a metal that is capable of reflecting the laser beam, the laser beam being reflected from the metal to the crystallization substrate.

The metal may have a reflectance of 50% or higher with respect to the laser beam.

The protection film may include an oxide, a nitride, or an organic matter, the laser beam passing through the protection film.

The protection film may be a single layer formed of an oxide, a nitride, or an organic material, or the protection film may be a plurality of layers, each layer being formed of an oxide, a nitride, or an organic material.

In the disposing of the crystallization substrate and the reflection substrate on one another, the crystallization substrate and the reflection substrate may be brought into contact with each other so that the amorphous silicon layer faces the reflection panel.

Selectively crystallizing the amorphous silicon layer may include directing the laser beam in a direction from the crystallization substrate toward the reflection substrate, and forming a polycrystalline silicon layer by crystallizing a first area of the amorphous silicon layer corresponding to the first region of the reflection substrate as the laser beam directed toward the reflection substrate is reflected by the reflection panel.

The forming of the polycrystalline silicon layer may include allowing the laser beam to pass through the first area of the amorphous silicon layer, and crystallizing the first area of the amorphous silicon layer by using the reflection panel in the first region of the reflection substrate to reflect the laser beam passing through the first area of the amorphous silicon layer onto the first area of the amorphous silicon layer.

The method may further include allowing the laser beam to pass through a second area of the crystallization substrate and the second region of the reflection substrate, wherein the second area of the amorphous silicon layer is not crystallized and remains as the amorphous silicon layer after the laser beam passes through the second area of the amorphous silicon layer corresponding to the second region of the reflection substrate.

The laser beam may be scanned in a direction perpendicular to the reflection panel.

The method may further include disassembling the crystallization substrate and the reflection substrate, after selectively crystallizing the amorphous silicon layer.

Another embodiment is directed to a method of manufacturing a transistor, the method including providing a crystallization substrate, the crystallization substrate having an amorphous silicon layer on a first substrate, providing a reflection substrate, the reflection substrate having a first region with a reflection panel therein and a second region without the reflection panel, disposing the crystallization substrate and the reflection substrate on one another, forming a polycrystalline silicon layer by selectively crystallizing the amorphous silicon layer by directing a laser beam onto the crystallization substrate and the reflection substrate, and reflecting the laser beam from the reflection panel, and forming a channel region and source and drain regions in the polycrystalline silicon layer.

The method may further include disassembling the crystallization substrate and the reflection substrate, after selectively crystallizing the amorphous silicon layer.

The method may further include forming a gate insulation film on the crystallization substrate to cover the polycrystalline silicon layer, forming a gate electrode on the gate insulation film, the gate electrode corresponding to the channel region of the polycrystalline silicon layer, forming an interlayer insulation film on the gate insulation film to cover the gate electrode, and forming a source electrode and a drain electrode which are disposed on the interlayer insulation film and electrically connected to the source region and the drain region of the polycrystalline silicon layer, respectively.

Forming the polycrystalline silicon layer may include directing the laser beam in a direction from the crystallization substrate toward the reflection substrate, and crystallizing a first area of the amorphous silicon layer corresponding to the first region of the reflection substrate as the laser beam directed toward the reflection substrate is reflected by the reflection panel.

The method may further include allowing the laser beam to pass through a second area of the crystallization substrate and the second region of the reflection substrate, wherein the second area of the amorphous silicon layer is not crystallized and remains as the amorphous silicon layer after the laser beam passes through the second area of the amorphous silicon layer corresponding to the second region of the reflection substrate.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
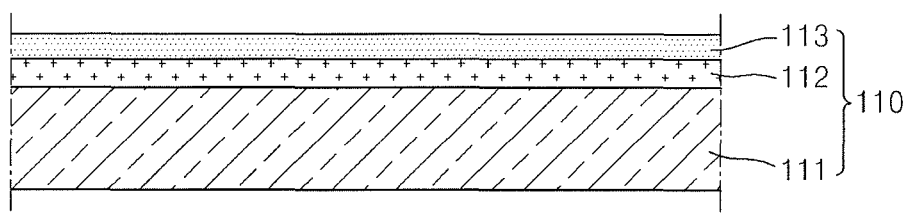
FIGS. 1-3 illustrate cross-sectional views of aspects of a method of manufacturing a polycrystalline silicon layer according to a first example embodiment.

Korean Patent Application No. 10-2010-0071598, filed on Jul. 23, 2010, in the Korean Intellectual Property Office, and entitled: "Method of Manufacturing Polycrystalline Silicon Layer, and Method of Manufacturing Thin-Film Transistor Comprising the Polycrystalline Silicon Layer," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
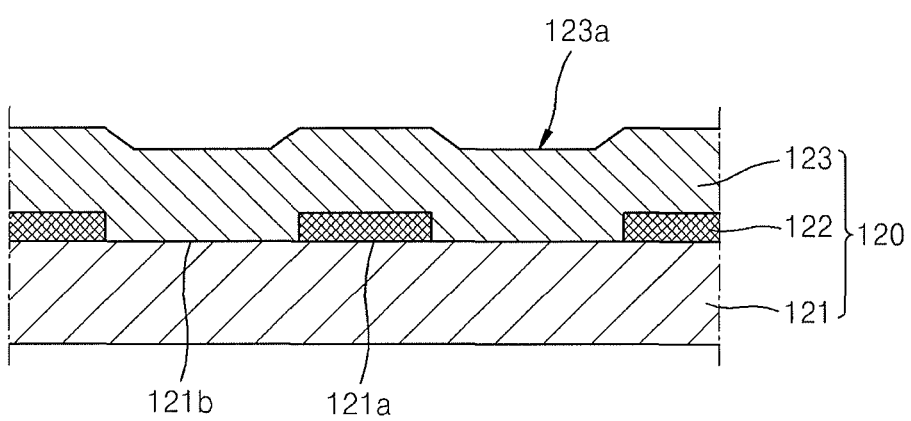
Figure 3:
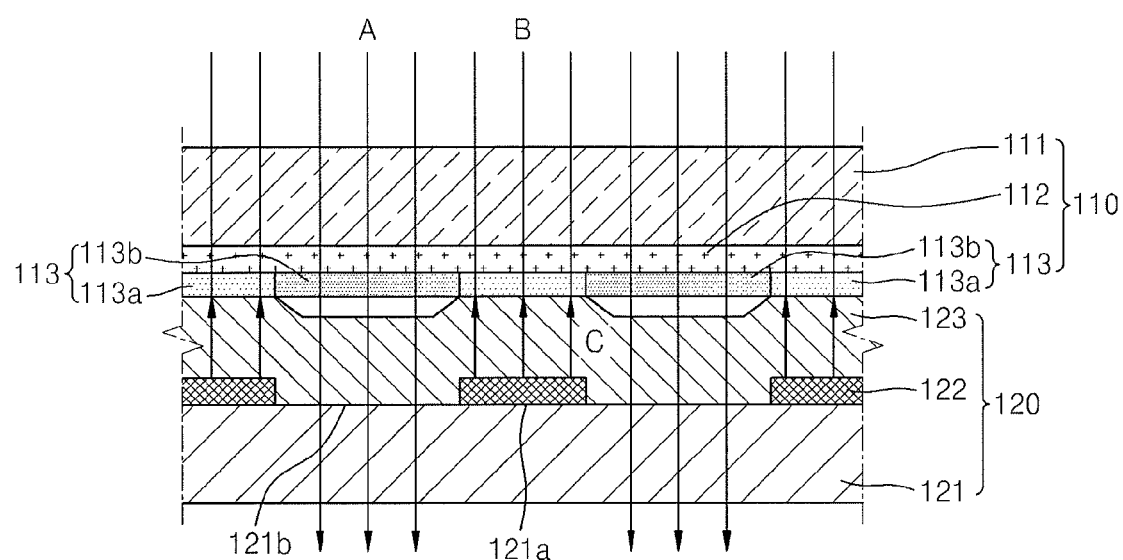

FIGS. 1-3 illustrate cross-sectional views of aspects of a method of manufacturing a polycrystalline silicon layer according to a first example embodiment. FIG. 1 schematically illustrates a crystallization substrate 110. Referring to FIG. 1, the crystallization substrate 110 may include a first substrate 111, a buffer layer 112, and an amorphous silicon layer 113. The buffer layer 112 may be formed on the first substrate 111. The amorphous silicon layer 113 may be formed on the buffer layer 112.

The first substrate 111 may be formed of, e.g., a glass material that is transparent and includes $SiO_2$ as a main component. In another implementation, the first substrate 111 may be formed of a material transparent to a laser beam used for crystallization, as described further below.

The buffer layer 112 may prevent intrusion of foreign materials into the first substrate 111 and planarize a surface of the first substrate 111. The buffer layer 112 may be formed of, e.g., silicon nitride, silicon oxynitride, etc.

The amorphous silicon layer 113 may be formed on the buffer layer 112 using, e.g., a chemical vapor deposition (CVD) method. The amorphous silicon layer 113 formed by the CVD method may include gas such as hydrogen. The gas may generate a problem such as decreasing electron mobility. Thus, a dehydrogenation process may be performed in order to remove hydrogen the amorphous silicon layer 113. The dehydrogenation process may be omitted, depending on the particular requirements.

FIG. 2 schematically illustrates a reflection substrate 120. Referring to FIG. 2, the reflection substrate 120 may include a second substrate 121, a reflection panel 122, and a protection film 123.

The second substrate 121 may be formed of, e.g., a transparent material such as glass or quartz. In another implementation, the second substrate 121 may be formed of another material transparent to the laser beam.

The second substrate 121 may be sectioned into a first region 121a and a second region 121b, with the reflection panel 122 being arranged in the first region 121a, and not in the second region 121b. When a laser beam is scanned toward a surface of the second substrate 121 where the reflection panel 122 is arranged, the laser beam proceeding toward the first region 121a is reflected by the reflection panel 122. The laser beam proceeding toward the second region 121b passes through the second substrate 121, as described below.

The reflection panel 122 may be patterned on the second substrate 121. For example, the reflection panel 122 may be arranged in the first region 121a of the second substrate 121, but not in the second region 121b of the second substrate 121. The reflection panel 122 may be formed of, e.g., metal, that may reflect the laser beam. For example, the reflection panel 122 may be formed of metal that may reflect a laser beam by 50% or higher. The reflection panel 122 may be formed by, e.g., forming a metal layer on the second substrate 121 and then patterning the metal layer.

The protection film 123 may be formed on the second substrate 121 to cover the reflection panel 122. The protection film 123 may be formed to cover not only the reflection panel 122 but also the second region 121b of the second substrate 121. The protection film 123 may be formed of, e.g., an oxide, a nitride, or an organic matter, transparent to the laser beam.

The protection film 123 may be a single layer, e.g., formed of one selected from the group of oxide, nitride, and an organic compound. In another implementation, the protection film 123 may be a plurality of layers each formed of one selected from the group of oxide, nitride, and an organic compound. The protection film 123 may include a groove 123a corresponding to the second region 121b.

FIG. 3 schematically illustrates a method of assembling the crystallization substrate 110 and the reflection substrate 120, and scanning a laser beam onto an assembled structure.

The crystallization substrate 110 and the reflection substrate 120 may be prepared and placed on one another as illustrated in FIG. 3. In the structure in which the crystallization substrate 110 and the reflection substrate 120 are placed on one another, the crystallization substrate 110 and the reflection substrate 120 may be assembled such that the amorphous silicon layer 113 of the crystallization substrate 110 faces the reflection panel 122 of the reflection substrate 120. Thus, the amorphous silicon layer 113 and the reflection panel 122 may be arranged facing each other with the protection film 123 interposed therebetween.

After the crystallization substrate 110 and the reflection substrate 120 are placed on one another, a part of the amorphous silicon layer 113 may be crystallized by scanning the laser beam thereto. In detail, after the crystallization substrate 110 and the reflection substrate 120 are placed on one another, the laser beam may be irradiated in a direction from the crystallization substrate 110 toward the reflection substrate 120. The laser beam may be scanned perpendicularly to a surface of the reflection panel 122. The laser beam irradiated in a direction from the crystallization substrate 110 toward the reflection substrate 120 passes through the crystallization substrate 110, but the laser beam is reflected in parts by the reflection substrate 120, as explained in greater detail below.

For convenience of description, the laser beam is shown in FIG. 3 as having two aspects: first, laser beam A that penetrates a region that does not have the reflection panel 122 therein; and, second, laser beam B that penetrates a region that has the reflection panel 122 therein. Of the laser beam irradiated in the direction from the crystallization substrate 110 toward the reflection substrate 120, the laser beam B (proceeding toward the first region 121a where the reflection panel 122 is arranged) is reflected by the reflection panel 122. In contrast, the laser beam A (proceeding toward the second region 121b where the reflection panel 122 is not arranged) passes through the reflection substrate 120.

A part of the laser beam B is absorbed by a first area 113a of the amorphous silicon layer 113, which corresponds to the first region 121a. The other part of the laser beam B that passed through the first area 113a is then reflected by the reflection panel 122 and proceeds back to the first area 113a. Here, laser beam C denotes the laser beam that is reflected by the reflection panel 122 and proceeds back to the first area 113a.

The first area 113a of the amorphous silicon layer 113 may be crystallized by absorbing a part of the laser beam B proceeding from the crystallization substrate 110 toward the reflection substrate 120 and the other part of the laser beam B that is reflected by the reflection panel 122. In other words, the amorphous silicon layer 113 is not crystallized with only the scanning of the laser beam A or B proceeding from the crystallization substrate 110 toward the reflection substrate 120. Rather, the crystallization of the amorphous silicon layer 113 (to form a polycrystalline area) may be achieved by the scanning of the laser beam B proceeding from the crystallization substrate 110 toward the reflection substrate 120 and the laser beam C reflected by the reflection panel 122.

Further, the laser beam A corresponds to a second area 113b of the amorphous silicon layer 113 (itself corresponding to the second region 121b of the second substrate 121 where no reflection panel exists). Here, only a part of the laser beam A is absorbed in the second area 113b (and no reflected laser beam exists), so that the second area 113b of the amorphous silicon layer 113 is not crystallized.

The power of the laser beam (i.e., laser beams A, B) that is initially scanned may be adjusted such that the amorphous silicon layer 113 may not be crystallized by the power of the initial transit of the laser beam alone (i.e., by laser beam A or B), but may be crystallized by a sum of the power of the laser beam (i.e., laser beam B in the reflection region) and the power of the laser beam C that is reflected. Accordingly, the crystallization of the amorphous silicon layer 113 may be performed by the laser beam B proceeding toward the reflection substrate 120 and the laser beam C that is reflected by the reflection panel 122. Thus, the amorphous silicon layer 113 may be selectively and easily crystallized in correspondence with the pattern of the reflection panel 122. Also, various shapes of crystallizations of the amorphous silicon layer 113 may be obtained according to the shape of the pattern of the reflection panel 122.

Furthermore, according to the present embodiment, there is no need to crystallize the entire surface of the amorphous silicon layer 113 and then pattern a resultant crystallized silicon layer by a photolithography method, as in a conventional technology. Thus, a manufacturing process may be simplified and manufacturing costs may be reduced.

In addition, according to the present embodiment, there is no need to crystallize the amorphous silicon layer 113 directly by the initially scanned laser beam (i.e., laser beams A, B). Thus, the power of the initially scanned laser beam (i.e., laser beams A, B) may be reduced so that costs for scanning a laser beam may be reduced.

After a part of the amorphous silicon layer 113 is crystallized, the crystallization substrate 110 and the reflection substrate 120 may be disassembled.

Figure 4:
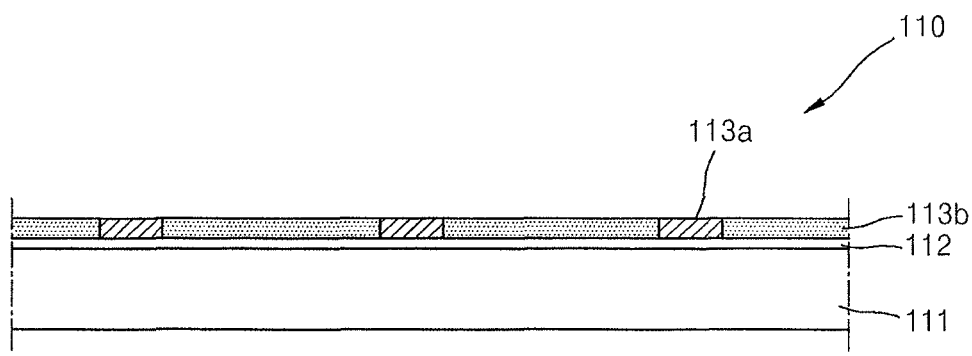
FIGS. 4 and 5 illustrate cross-sectional views of stages in a method of manufacturing a thin-film transistor, according to a second example embodiment.
Figure 5:
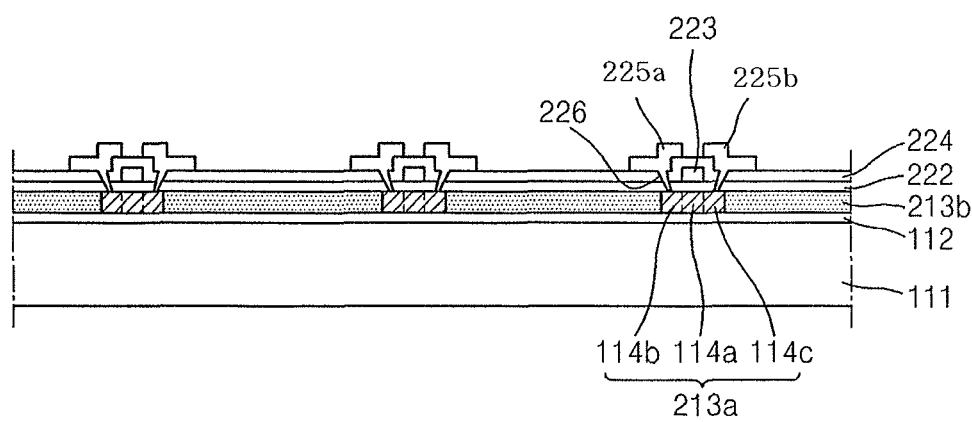
Figure 6:
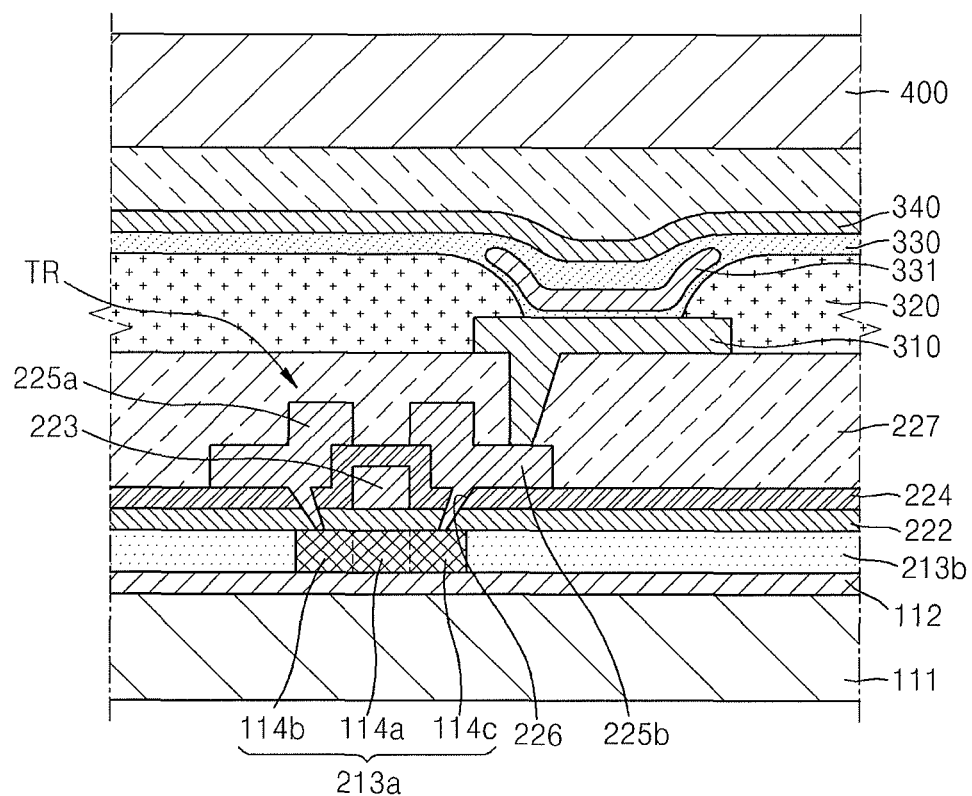
FIG. 6 illustrates a cross-sectional view of an organic light-emitting display device including a thin-film transistor, according to a third example embodiment.

FIGS. 4 and 5 illustrate cross-sectional views of stages in a method of manufacturing a thin-film transistor, according to a second example embodiment. FIG. 6 illustrates a cross-sectional view of an organic light-emitting display device including a thin-film transistor, according to a third example embodiment.

Referring to FIG. 4, the crystallization substrate 110 is manufactured by the above-described method of manufacturing a polycrystalline silicon layer. The crystallization substrate 110 may include a crystallized area of the amorphous silicon layer that was irradiated with a laser to form polycrystalline silicon using the reflection panel 122, the reflection panel 122 having a pattern corresponding to areas where thin film transistors are to be formed. Here, the crystallized area is referred to as a polycrystalline silicon layer 213a, and an uncrystallized area (i.e., an area with no corresponding reflection panel 122) is referred to as an amorphous silicon layer 213b. Since the method of manufacturing the crystallization substrate 110 is described above, details thereof will not be repeated.

Referring to FIG. 5, a gate insulation film 222 may be formed to cover both of the polycrystalline silicon layer 213a and the amorphous silicon layer 213b. As the gate insulation film 222, an inorganic insulation film, such as silicon oxide or silicon nitride, may be formed in, e.g., a single layer or a plurality of layers.

In the second example embodiment shown in FIG. 5, a gate electrode 223 is formed on the gate insulation film 222 to correspond to a channel region 114a of the polycrystalline silicon layer 213a. An interlayer insulation film 224 is formed to cover the gate electrode 223.

The polycrystalline silicon layer 213a is divided into the channel region 114a and source and drain regions 114b and 114c, which may be formed by doping the source and drain regions 114b and 114c with N-type or P-type impurities by using the gate electrode 223 as a self-aligning mask, after the gate electrode 223 is formed. In another implementation, the channel region 114a and source and drain regions 114b and 114c may be formed by doping the channel region 114a and source and drain regions 114b and 114c with impurities after the polycrystalline silicon layer 113a is formed.

A source electrode 225a and a drain electrode 225b may be formed to respectively contact the source region 114b and the drain region 114c through respective contact holes 226.

Referring to FIG. 6, a planarization film 227 may be formed on the interlayer insulation film 224 so as to cover the thin-film transistor TR. The planarization film 227 may be, e.g., an insulation film in a single layer or a plurality of layers with a flat upper surface. The planarization film 227 may be formed of an inorganic material and/or an organic material.

A via hole may be formed to expose the drain electrode 225b of the thin-film transistor TR, the via hole penetrating the planarization film 227. The thin-film transistor TR and a pixel electrode 310 formed in a predetermined pattern on the planarization film 227 may be electrically connected to each other through the via hole.

A pixel defining layer (PDL) 320 may be formed on the planarization film 227, e.g., to cover the side portions of the pixel electrode 310. The PDL 320 may define a pixel by covering the side portions of the pixel electrode 310 with a predetermined thickness. Also, the PDL 320 may increase a distance between an end portion of the pixel electrode 310 and an opposite electrode 340 (described below) so that generation of arc at the end portion of the pixel electrode 310 may be prevented.

An organic film 330, including a light-emitting layer 331, and the opposite electrode 340 may be sequentially formed on the pixel electrode 310. The organic film 330 may be, e.g., a low molecular weight or high molecular weight organic film. When a low molecular weight organic film is used, a hole injection layer (HIL), a hole transport layer (HTL), an emission layer (EML) 331, an electron transport layer (ETL), and an electron injection layer (EIL) may be stacked in a single or combined structure. Suitable organic materials may include, e.g., copper phthalocyanine (CuPc), N,N'-Di(naphthalene-1-yl)-N,N'-diphenyl-benzidine (NPB), and tris-8-hydroxyquinoline aluminum ($Alq_3$).

When a high molecular weight organic film is used, only the HTL may be included in a direction along the pixel electrode 310 with respect to the light-emitting layer 331. The HTL may be formed of, e.g., poly-(2,4)-ethylene-dihydroxy thiophene (PEDOT) or polyaniline (PANI). The light-emitting layer may be independently formed for each red, green, and blue pixel, while the HIL, the HTL, the ETL, and the EIL may be commonly applied for the red, green, and blue pixels, as common layers.

A sealing substrate 400 may be combined to the first substrate 111 by a combining member (not shown).

Above, an organic light-emitting display device is described as an example display device having a thin-film transistor according to an embodiment. However, it will be appreciated that embodiments may be applied to various display devices, including liquid crystal display devices, etc.

As described above, according to embodiments, an amorphous silicon layer may be selectively crystallized, i.e., crystallized only in the area(s) where crystallization is required. Further, embodiments may enable the use of lower-power lasers while avoiding the need for post-crystallization patterning.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present embodiment as set forth in the following claims.

What is claimed is:

1. A method of manufacturing a polycrystalline silicon layer, the method comprising:
    providing a crystallization substrate, the crystallization substrate having an amorphous silicon layer on a first substrate;
    providing a reflection substrate, the reflection substrate having a first region with a reflection panel therein and a second region without the reflection panel;
    disposing the crystallization substrate and the reflection substrate on one another; and
    selectively crystallizing the amorphous silicon layer by directing a laser beam through the crystallization substrate and onto the reflection substrate, and reflecting the laser beam from the reflection panel back through the crystallization substrate.

2. The method as claimed in claim 1, wherein the crystallization substrate has a buffer layer between the first substrate and the amorphous silicon layer.

3. The method as claimed in claim 2, wherein the first substrate includes a transparent material, the laser beam passing through the first substrate.

4. The method as claimed in claim 3, wherein the first substrate is a glass substrate.

5. The method as claimed in claim 1, wherein the reflection substrate includes:
    a second substrate, the reflection panel being a pattern on the second substrate; and
    a protection film arranged on the second substrate to cover the reflection panel.

6. The method as claimed in claim 5, wherein the second substrate includes a transparent material, the laser beam passing through the transparent material.

7. The method as claimed in claim 6, wherein the second substrate is glass or quartz.

8. The method as claimed in claim 5, wherein the reflection panel includes a metal that is capable of reflecting the laser beam, the laser beam being reflected from the metal to the crystallization substrate.

9. The method as claimed in claim 8, wherein the metal has a reflectance of 50% or higher with respect to the laser beam.

10. The method as claimed in claim 5, wherein the protection film includes an oxide, a nitride, or an organic matter, the laser beam passing through the protection film.

11. The method as claimed in claim 10, wherein:
    the protection film is a single layer formed of an oxide, a nitride, or an organic material, or
    the protection film is a plurality of layers, each layer being formed of an oxide, a nitride, or an organic material.

12. The method as claimed in claim 1, wherein, in the disposing of the crystallization substrate and the reflection substrate on one another, the crystallization substrate and the reflection substrate are brought into contact with each other so that the amorphous silicon layer faces the reflection panel.

13. The method as claimed in claim 1, wherein selectively crystallizing the amorphous silicon layer comprises:
    directing the laser beam in a direction from the crystallization substrate toward the reflection substrate; and forming a polycrystalline silicon layer by crystallizing a first area of the amorphous silicon layer corresponding to the first region of the reflection substrate as the laser beam directed toward the reflection substrate is reflected by the reflection panel.

14. The method as claimed in claim 13, wherein the forming of the polycrystalline silicon layer comprises:
allowing the laser beam to pass through the first area of the amorphous silicon layer; and
crystallizing the first area of the amorphous silicon layer by using the reflection panel in the first region of the reflection substrate to reflect the laser beam passing through the first area of the amorphous silicon layer onto the first area of the amorphous silicon layer.

15. The method as claimed in claim 13, further comprising allowing the laser beam to pass through a second area of the crystallization substrate and the second region of the reflection substrate, wherein the second area of the amorphous silicon layer is not crystallized and remains as the amorphous silicon layer after the laser beam passes through the second area of the amorphous silicon layer corresponding to the second region of the reflection substrate.

16. The method as claimed in claim 1, wherein the laser beam is scanned in a direction perpendicular to the reflection panel.

17. The method as claimed in claim 1, further comprising disassembling the crystallization substrate and the reflection substrate, after selectively crystallizing the amorphous silicon layer.

18. A method of manufacturing a transistor, the method comprising:
providing a crystallization substrate, the crystallization substrate having an amorphous silicon layer on a first substrate;
providing a reflection substrate, the reflection substrate having a first region with a reflection panel therein and a second region without the reflection panel;
disposing the crystallization substrate and the reflection substrate on one another;
forming a polycrystalline silicon layer by selectively crystallizing the amorphous silicon layer by directing a laser beam through the crystallization substrate and onto the reflection substrate, and reflecting the laser beam from the reflection panel back through the crystallization substrate; and
forming a channel region and source and drain regions in the polycrystalline silicon layer.

19. The method as claimed in claim 18, further comprising:
disassembling the crystallization substrate and the reflection substrate, after selectively crystallizing the amorphous silicon layer.

20. The method as claimed in claim 18, further comprising:
forming a gate insulation film on the crystallization substrate to cover the polycrystalline silicon layer;
forming a gate electrode on the gate insulation film, the gate electrode corresponding to the channel region of the polycrystalline silicon layer;
forming an interlayer insulation film on the gate insulation film to cover the gate electrode; and
forming a source electrode and a drain electrode which are disposed on the interlayer insulation film and electrically connected to the source region and the drain region of the polycrystalline silicon layer, respectively.

21. The method as claimed in claim 18, wherein forming the polycrystalline silicon layer comprises:
directing the laser beam in a direction from the crystallization substrate toward the reflection substrate; and
crystallizing a first area of the amorphous silicon layer corresponding to the first region of the reflection substrate as the laser beam directed toward the reflection substrate is reflected by the reflection panel.

22. The method as claimed in claim 21, further comprising allowing the laser beam to pass through a second area of the crystallization substrate and the second region of the reflection substrate, wherein the second area of the amorphous silicon layer is not crystallized and remains as the amorphous silicon layer after the laser beam passes through the second area of the amorphous silicon layer corresponding to the second region of the reflection substrate.

* * * * *